United States Patent
Fitzgerald et al.

(10) Patent No.: US 8,556,358 B2
(45) Date of Patent: Oct. 15, 2013

(54) ROBUST LIGHTWEIGHT ELECTRONIC RACK ENCLOSURE

(75) Inventors: Lyndal W. Fitzgerald, Stillwater, OK (US); Jimmie B. Allred, III, Skaneateles, NY (US)

(73) Assignees: Frontier Electronic Systems Corp, Stillwater, OK (US); Allred & Associates Inc., Elbridge, NY (US)

( * ) Notice: Subject to any disclaimer, the term of this patent is extended or adjusted under 35 U.S.C. 154(b) by 256 days.

(21) Appl. No.: 13/098,449

(22) Filed: Apr. 30, 2011

(65) Prior Publication Data

US 2011/0267749 A1 Nov. 3, 2011

Related U.S. Application Data

(60) Provisional application No. 61/330,044, filed on Apr. 30, 2010.

(51) Int. Cl.
*A47B 47/05* (2006.01)

(52) U.S. Cl.
USPC ............. 312/265.4; 312/265.1; 248/562; 361/679.02

(58) Field of Classification Search
USPC ............ 312/265.1, 265.4, 223.1, 223.2, 351, 312/351.1; 248/560, 562, 580, 581, 605, 248/610, 615, 618, 632; 361/679.01, 361/679.02; 174/50; 410/87
See application file for complete search history.

(56) References Cited

U.S. PATENT DOCUMENTS

| | | | | | |
|---|---|---|---|---|---|
| 5,112,422 | A | * | 5/1992 | Takahashi | 156/175 |
| 5,889,648 | A | * | 3/1999 | Heavirland et al. | 361/600 |
| 6,002,588 | A | * | 12/1999 | Vos et al. | 361/708 |
| 6,036,290 | A | * | 3/2000 | Jancsek et al. | 312/265.4 |
| 6,155,660 | A | * | 12/2000 | Nicolai | 312/223.1 |
| 6,648,295 | B2 | * | 11/2003 | Herren et al. | 248/636 |
| 2002/0162808 | A1 | * | 11/2002 | Jordan | 211/26 |
| 2002/0162937 | A1 | * | 11/2002 | Sebert et al. | 248/618 |
| 2002/0179806 | A1 | * | 12/2002 | Teng | 248/618 |
| 2010/0000950 | A1 | * | 1/2010 | Malekmadani | 211/26 |

FOREIGN PATENT DOCUMENTS

JP 2007187297 A * 7/2007

* cited by examiner

*Primary Examiner* — Darnell Jayne
*Assistant Examiner* — Sasha T Varghese
(74) *Attorney, Agent, or Firm* — Martin S. High, P.C.

(57) ABSTRACT

The embodiments of the instant invention comprise a lightweight, robust electronic rack enclosure. The embodiments are comprised of an outer chassis, an inner chassis, bottom vibration isolators, and top vibration isolators. The outer chassis is comprised of an outer chassis door, two outer chassis side assemblies, an outer chassis top panel, an outer chassis bottom panel, and an outer chassis back panel. The inner chassis is comprised of two inner chassis side assemblies, an inner chassis top panel, and an inner chassis bottom panel. Each outer chassis side assembly is comprised of a flat outer chassis side panel, one or more diagonal reinforcing members, one or more horizontal reinforcing members, and one or more vertical reinforcing members. Each inner chassis side assembly is comprised of an inner chassis flat side panel, and one or more inner chassis side panel horizontal supports.

16 Claims, 20 Drawing Sheets

ROBUST LIGHTWEIGHT ELECTRONIC RACK ENCLOSURE

CROSS-REFERENCE TO RELATED APPLICATIONS

This application claims priority of the provisional application with Ser. No. 61/330,044 titled "robust lightweight electronic rack enclosure" filed on Apr. 30, 2010. The entire contents of provisional application 61/330,044 are herein incorporated by reference.

STATEMENT REGARDING FEDERALLY SPONSORED RESEARCH OR DEVELOPMENT

Not applicable

FIELD OF THE EMBODIMENTS

The field of the embodiments is electronics and more specifically the housing of rack-mountable electronic components in robust, lightweight rack system that isolates the electronic components from vibration from the surroundings.

BACKGROUND OF THE EMBODIMENTS

Electronic components are commonly manufactured in component form. These electronic components are commonly housed in electronic chassis with identical size and attachment mechanisms that slide into electronic rack enclosures. The electronic rack enclosures allow the user of the electronic components to readily access the electronic components and interconnect the components with the appropriate electronic connections. Therefore, the electronic rack enclosures serve as means of storing and protecting valuable electronic components.

These electronic rack enclosures are typically rectangular in shape and have historically been made of metal, either stainless steel or aluminum. In hostile environments these electronic rack enclosures undergo significant mechanical stresses. These mechanical stresses are in the form of mechanical vibrations over a broad spectrum of frequencies and amplitudes. Unfortunately, if the rack is not properly designed, the mechanical vibrations are transferred to the electronic components. Since electronic components are typically fragile and expensive, the transfer of the mechanical vibration stress can result in damage or destruction of expensive electronic equipment. Furthermore, in critical applications, transfer of mechanical vibration resulting in the destruction of the electronic component can produce a catastrophic loss of electronic functionality. Depending on the application and the electronic function, this loss could result in property damage and loss of life.

In any case, the electronic rack enclosures are storage devices for the electronic components. In many applications, particularly military applications, it is critical to make the enclosures that are structurally strong and isolate the electronic components from vibrations transferred from the surroundings. The easiest method of achieving strength and vibration isolation is to increase the mass of the components of the electronic rack enclosure. In many applications, however, increasing mass is not desirable or even possible.

There are many applications where a strong, vibration-free electronic rack enclosure must be also the lightest possible. In aerospace and naval applications, increased weight translates directly into additional costs, particularly fuel costs. Over the lifetime of the electronic component, any additional weight adds significantly to the use of the electronic component. Therefore, there are many applications where it is desirable to employ an electronic rack enclosure with the greatest possible strength and vibration isolation characteristics to meet the application requirements, but at the same time minimize the mass of the electronic rack enclosure.

SUMMARY OF THE EMBODIMENTS

Embodiments of the Robust Lightweight Electronic Rack Enclosure are comprised of an outer chassis, an inner chassis, bottom vibration isolators, and top vibration isolators. The outer chassis is comprised of an outer chassis door, two outer chassis side assemblies, an outer chassis top panel, an outer chassis bottom panel, and an outer chassis back panel. The inner chassis is comprised of two inner chassis side assemblies, an inner chassis top panel, and an inner chassis bottom panel.

In this respect, it is to be understood that the embodiments in this application are not limited to the details of construction and to the arrangements of the components set forth in the description or illustrated in the drawings. The embodiments are capable of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods and systems for carrying out the several purposes of the embodiments described in this application. Additional benefits and advantages of the present embodiments will become apparent in those skilled in the art to which the embodiments relate from the description of the preferred embodiment and the appended claims, taken in conjunction with the accompanying drawings. It is important, therefore, that the claims be regarded as including such equivalent constructions insofar as they do not depart from the spirit and scope of the embodiments described herein.

Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application. The abstract is neither intended to define the embodiments of the application, which is measured by the claims, nor is it intended to be limiting as to the scope of the embodiments in any way.

DETAILED DESCRIPTION OF THE PREFERRED EMBODIMENTS

Figure 1:
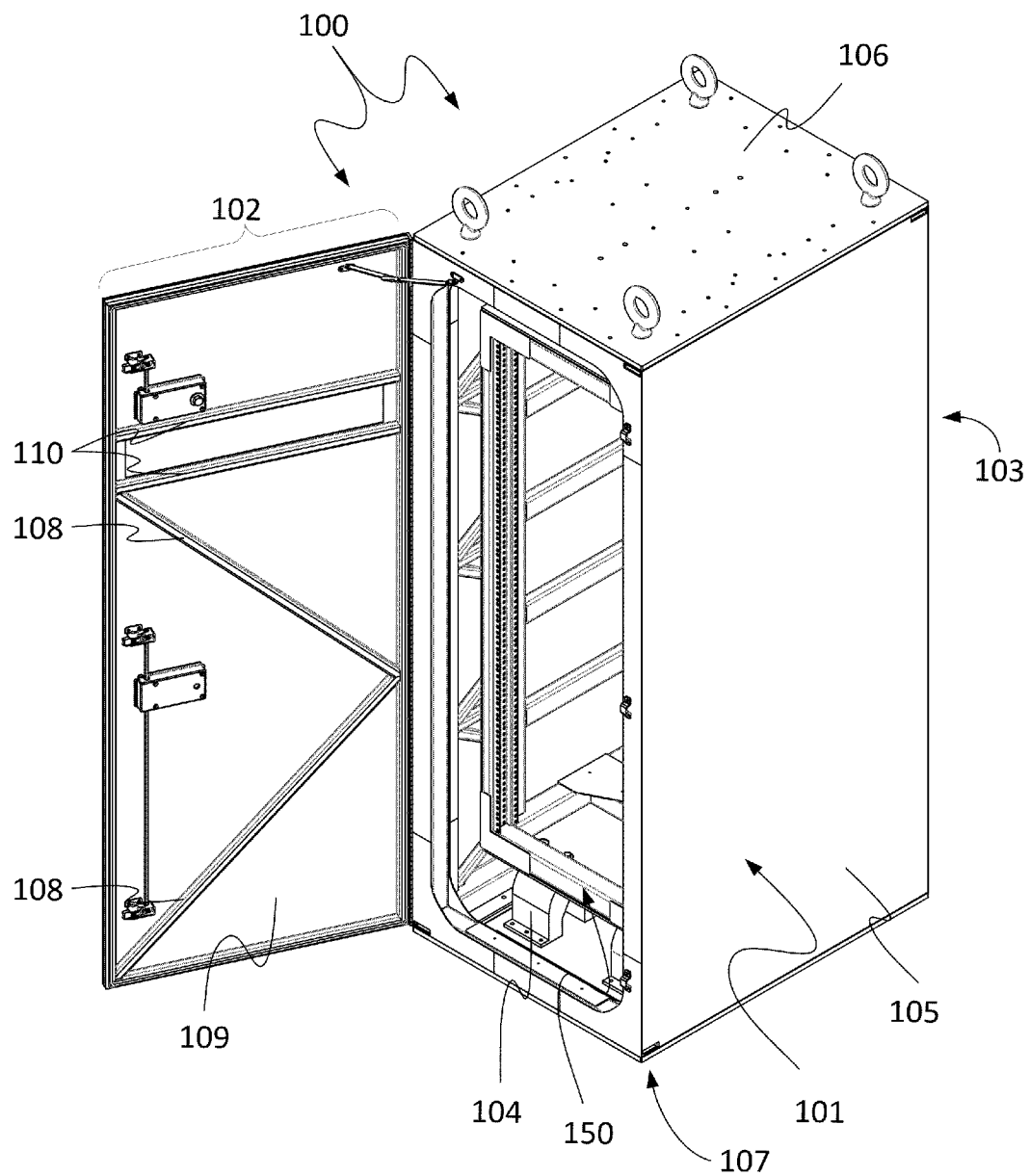
FIG. 1 is a perspective view of an embodiment of the Robust Lightweight Electronic Rack Enclosure.
Figure 2:
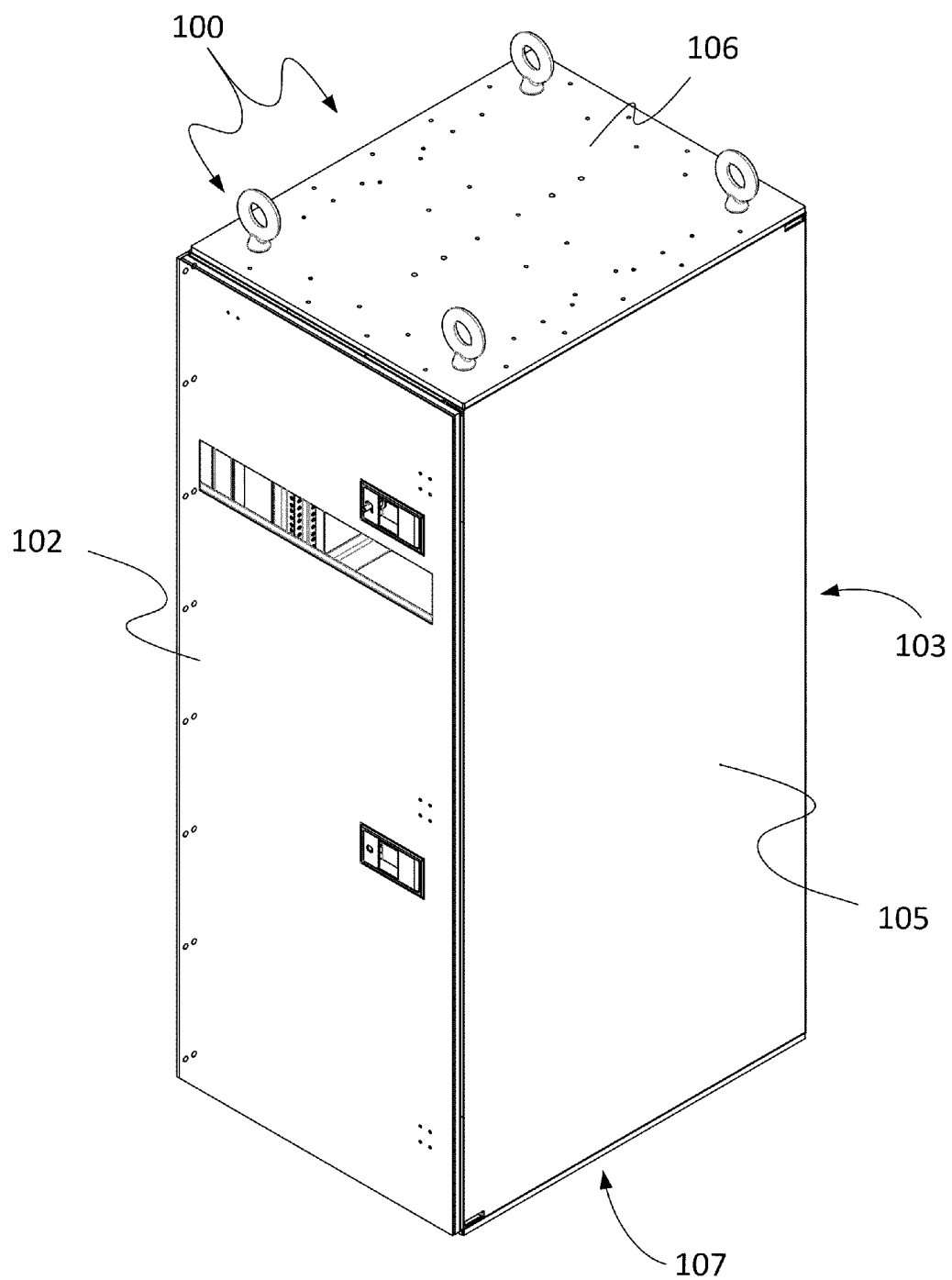
FIG. 2 is a perspective view of an embodiment of the Robust Lightweight Electronic Rack Enclosure with the outer chassis door closed.
Figure 3:
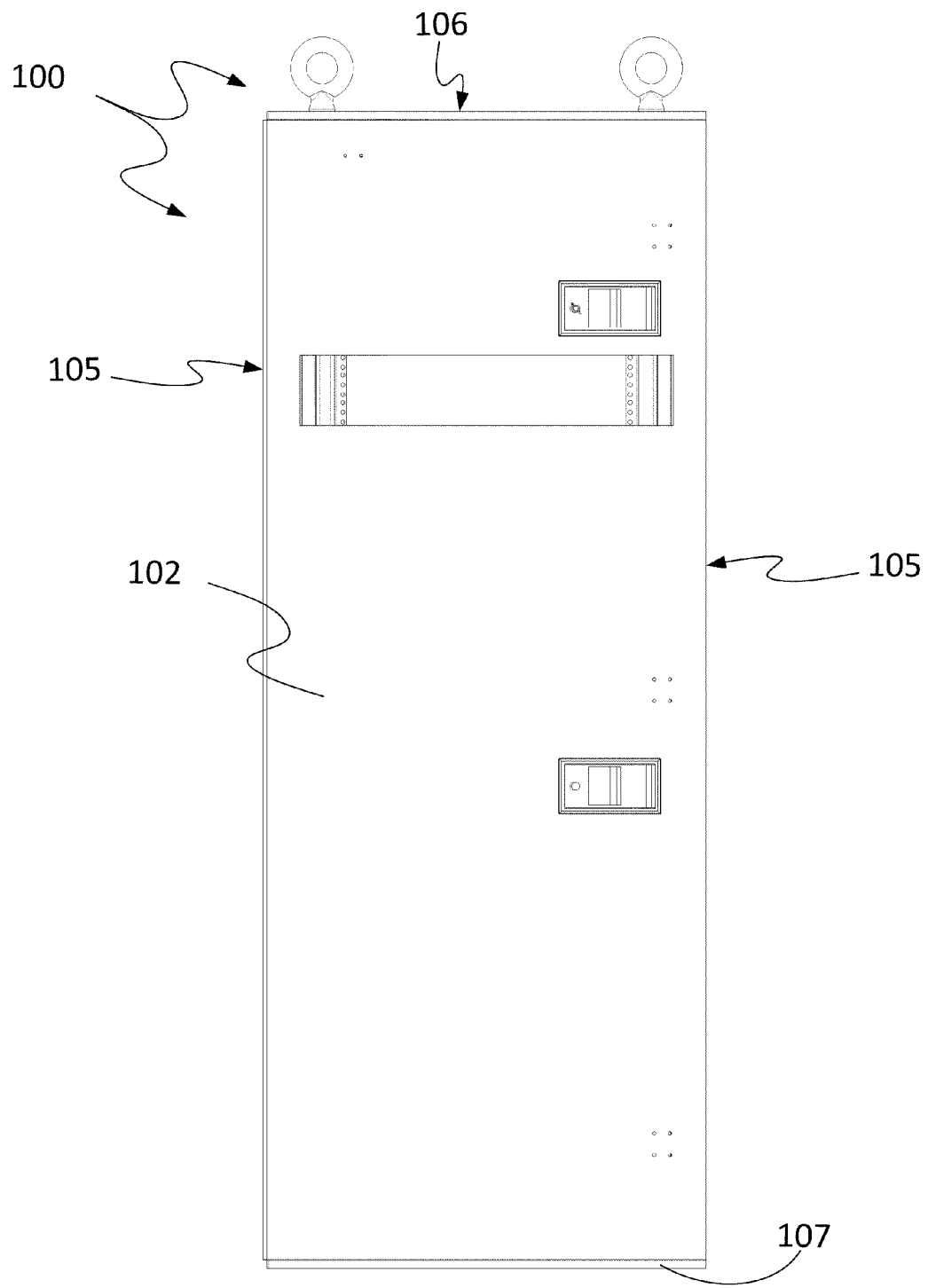
FIG. 3 is a front view of an embodiment of the Robust Lightweight Electronic Rack Enclosure with the outer chassis door closed.
Figure 4C:
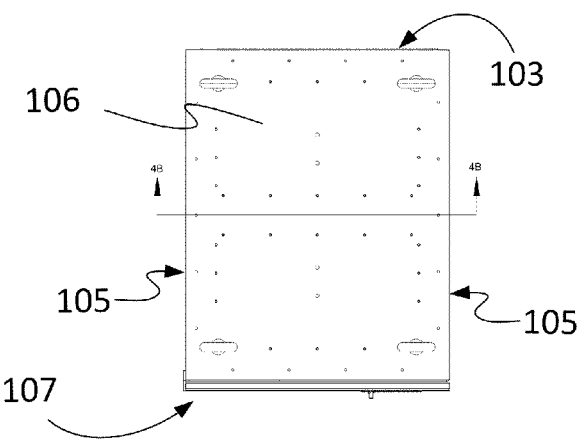
FIG. 4c is a top view of an embodiment of the electronic chassis.
Figure 4A:
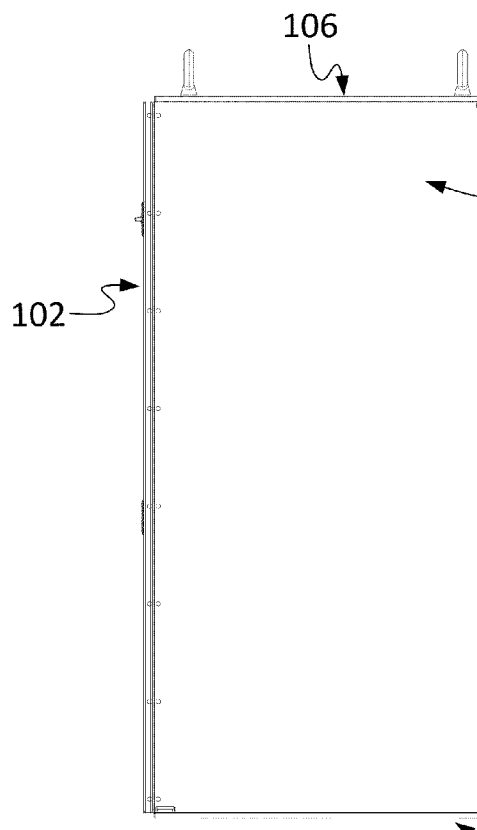
FIG. 4a is a side view of an embodiment of the Robust Lightweight Electronic Rack Enclosure.
Figure 4B:
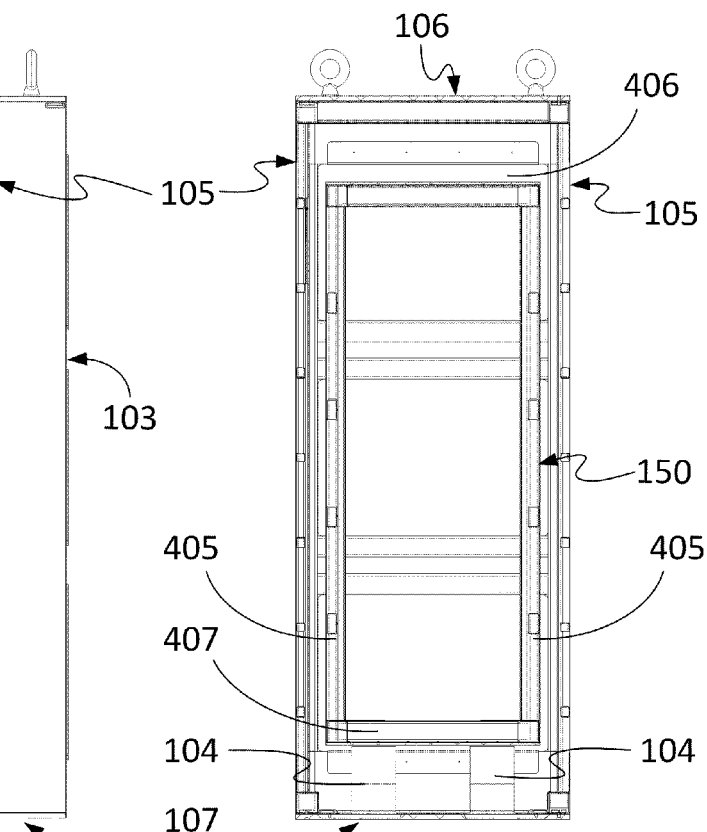
FIG. 4b is a front view of an embodiment of the Robust Lightweight Electronic Rack Enclosure with a sectional view of the electronic chassis.
Figure 5A:
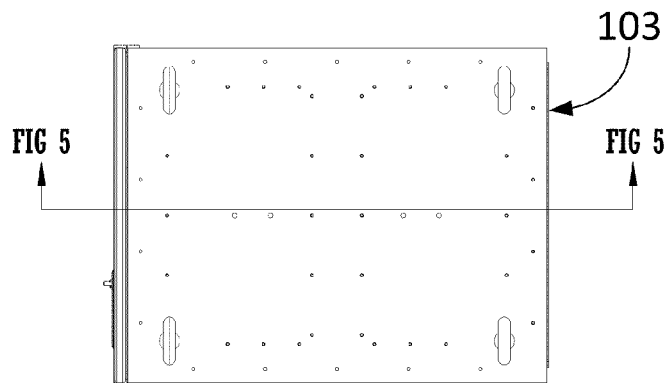
FIG. 5a is a top view of an embodiment of the Robust Lightweight Electronic Rack Enclosure.
Figure 5B:
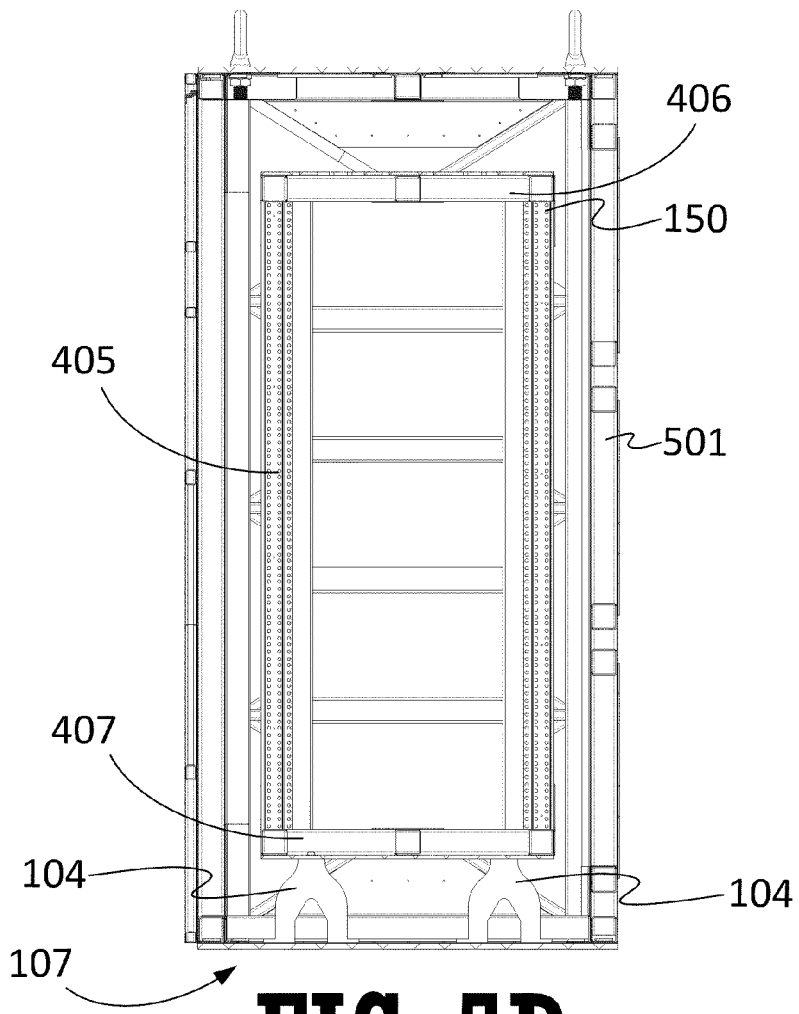
FIG. 5b is a front sectional view of an embodiment of the Robust Lightweight Electronic Rack Enclosure.
Figure 6:
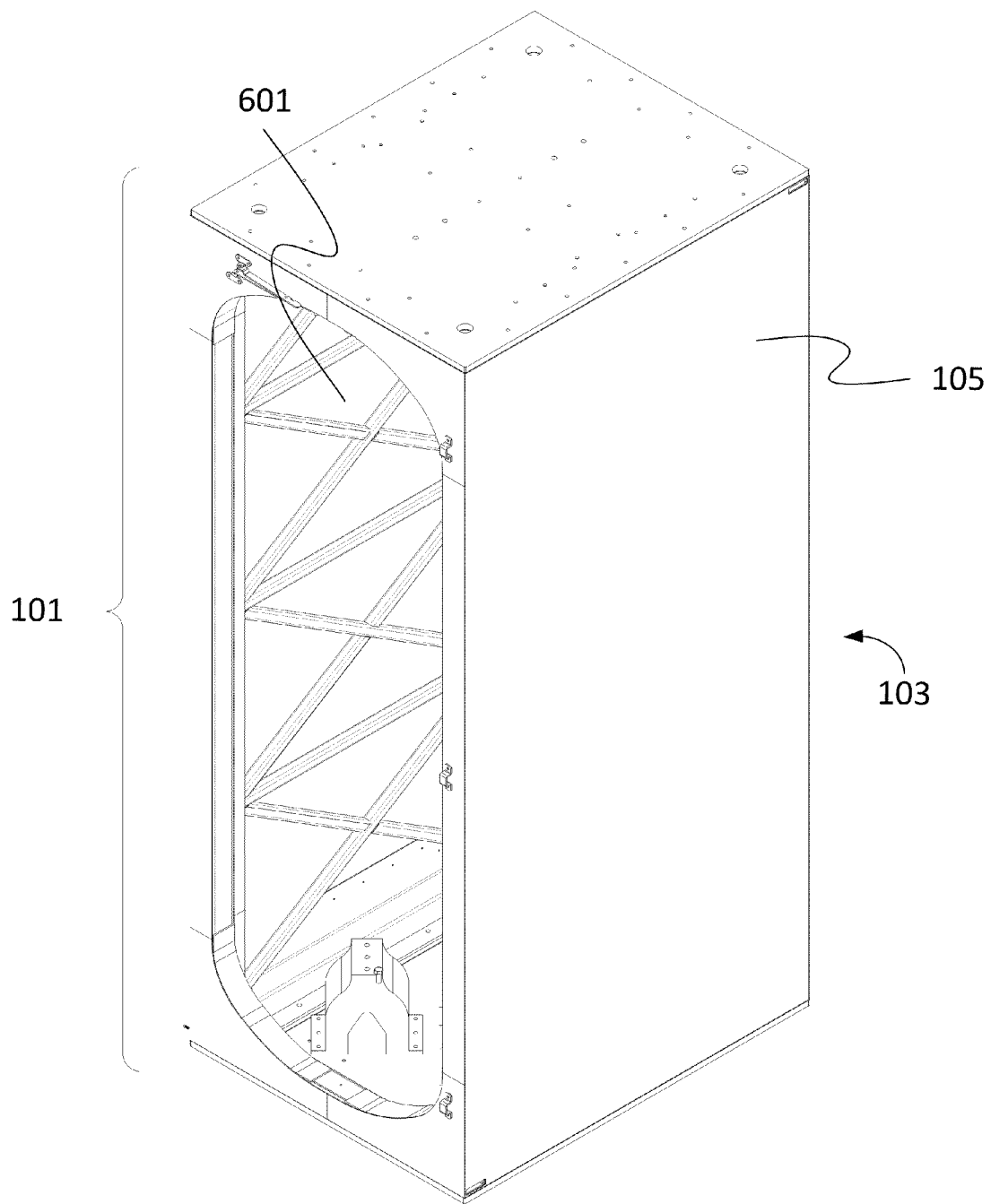
FIG. 6 is a perspective view of the outer chassis of an embodiment of the Robust Lightweight Electronic Rack Enclosure.

Embodiments of the Robust Lightweight Electronic Rack Enclosure 100 are comprised of an outer chassis 101, an inner chassis 150, bottom vibration isolators 104, and top vibration isolators 1701.

The outer chassis 101 is comprised of an outer chassis door 102, two outer chassis side assemblies 105, an outer chassis top panel assembly 106, an outer chassis bottom panel assembly 107, and an outer chassis back panel 103.

The inner chassis 150 is comprised of two inner chassis side assemblies 405, an inner chassis top panel assembly 406, and an inner chassis bottom panel 407. The inner chassis top panel assembly 406 is further comprised of a top panel 1101 which forms apertures 1104 through which various hardware such as hooks and hangers can be mounted. In addition the inner chassis top panel assembly 406 is further comprised of inner top panel edge members 1102 and inner top panel center members 1103 which provide structural support for the top panel.

The inner chassis bottom panel 407 is further comprised of a bottom panel 1201 which forms apertures 1204 through which various hardware such as hooks and hangers can be mounted. In addition the inner chassis bottom panel assembly 407 is further comprised of inner bottom panel edge members 1202 and inner bottom panel center members 1203 which provide structural support for the bottom panel.

The metallic materials include without limitation aluminum, steel or stainless steel. The composite materials include without limitation carbon fiber-reinforced polymer or carbon-fiber reinforced plastic composite materials wherein the polymer is commonly epoxy, but other polymers, such as polyester, vinyl ester or nylon, are sometimes used. The composite materials may also incorporate other reinforcing materials such as para-aramid synthetic polymer, aluminium, and fiberglass reinforcement materials. The terms graphite-reinforced polymer or graphite fiber-reinforced polymer (GFRP) are also used, but less commonly, since glass-(fiber)-reinforced polymer can also be called GFRP. In product advertisements, it is sometimes referred to simply as graphite fiber (or graphite fibre), for short.

In order to minimize the weight of all embodiments and yet maintain sufficient structural integrity of the Robust Lightweight Electronic Rack Enclosure, the outer chassis 101 and the inner chassis 150 and all of their subcomponents as described below are manufactured from carbon fiber-reinforced polymer (CFRP) material. CFRP material means any material that is produced by molding or forming carbon fiber material into any polymeric material including, without limitation, epoxy, polyester, vinyl ester or nylon. In addition, in place of or in addition to carbon fibers, other fibers such as para-aramid synthetic polymeric fibers (e.g., Kevlar fibers), aluminium fibers, and fiberglass fibers may be used as reinforcing fibers. Using CFRP as the main structural material significantly reduces the mass density of the Robust Lightweight Electronic Rack Enclosure. Using CFRP also necessitates using structural reinforcement of the components of the Robust Lightweight Electronic Rack Enclosure.

The term adhesive means indicates the application of an adhesive such as, but without limitation, epoxy or other natural or synthetic polymeric adhesives to the surface of the appropriate structural reinforcing component.

The term structural reinforcing component is meant to include the various diagonal, horizontal and vertical reinforcing flanges attached to the inside surface of the various inner and outer assemblies of the Robust Lightweight Electronic Rack Enclosure. The surface of the appropriate structural reinforcing component is then brought into contact with the corresponding surface of the mating surface to form an adhesive joint. This adhesive joint is cured to form a permanent adhesive joint.

The outer chassis 101 is assembled by mating the appropriate components via an adhesive means. As way of an example, the outer chassis top panel assembly 106 is connected to the two outer chassis side assemblies 105 through an adhesive means.

The inner chassis 150 is assembled by the appropriate mating components via an adhesive means. As way of an example, the inner chassis top panel 407 is connected to both inner chassis side assemblies 405 through an adhesive means.

The structural reinforcing components of each component of the outer chassis 101 and inner chassis 150 serve to strengthen the outer chassis 101 and inner chassis 150 to accommodate the various stress modes that the components of the Robust Lightweight Electronic Rack Enclosure experience and to provide surfaces to which adhesives can be applied to assemble the outer chassis 101 and inner chassis 150. The stress modes include elongational, compression, flexural and torsional stresses of various frequencies and amplitudes. In the various embodiments, these structural reinforcing components are attached to the inside of the assemblies. The structural reinforcing components are comprised of hollow tubes manufactured from CFRP. The cross-sectional geometries of the hollow CFRP tubes can be circular, square, triangular or rectangular. In the preferred embodiments of the Robust Lightweight Electronic Rack Enclosure, the cross-sectional geometry is square or rectangular with a side dimension of between ½ inch and 3 inches.

Figure 19A:
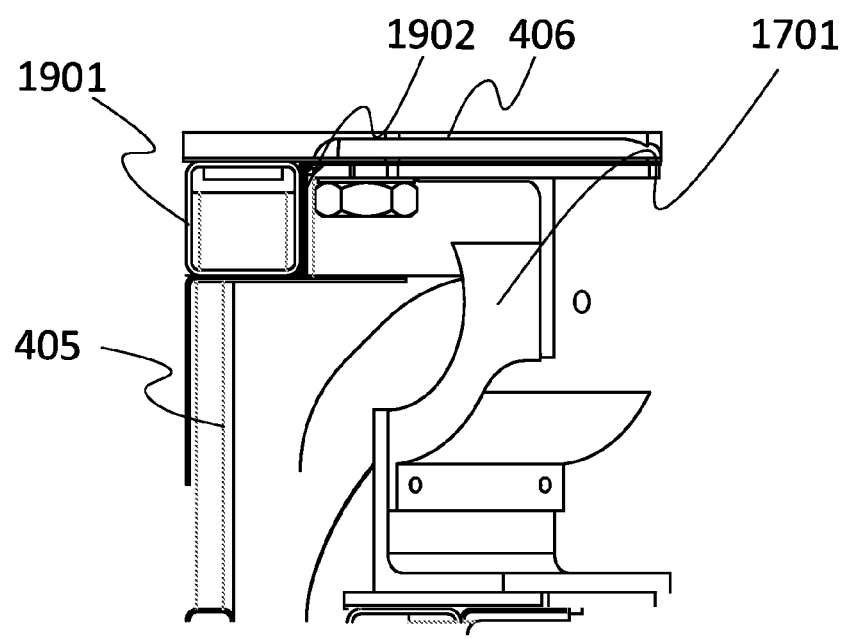
FIG. 19a is a front view showing a top corner detail of an embodiment of the Robust Lightweight Electronic Rack Enclosure.
Figure 19B:
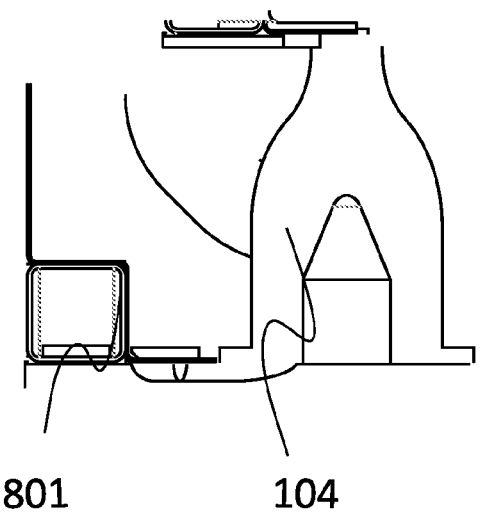
FIG. 19b is a front view showing a bottom corner detail of an embodiment of the Robust Lightweight Electronic Rack Enclosure.
Figure 20A:
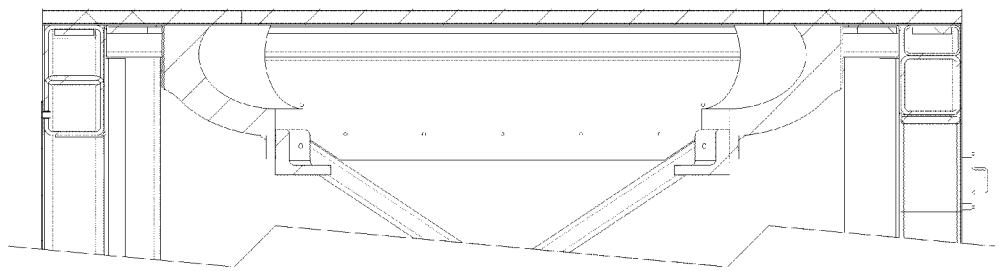
FIG. 20A is a front view derived from FIG. 9 showing a sectional detail of the top panel of the outer chassis of an embodiment the Robust Lightweight Electronic Rack Enclosure.
Figure 20B:
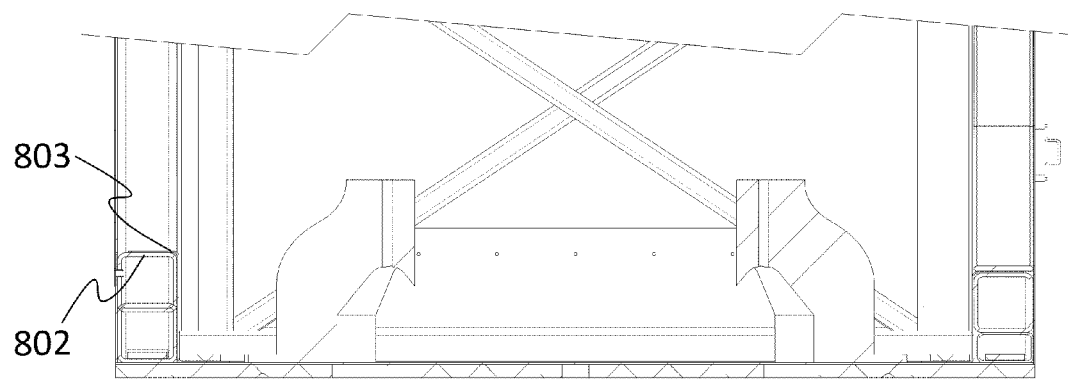
FIG. 20B is a front view derived from FIG. 8 showing a sectional detail of the top panel bottom panel of the outer chassis of an embodiment of the Robust Lightweight Electronic Rack Enclosure.

A detail of the edge and corner construction of the inner 150 and outer 101 chasses is illustrated in FIG. 19a (upper corner) and FIG. 19b (lower corner). The upper and lower edges of the chassis are constructed and reinforced with the hollow tube structural reinforcing components and an overlay of CFRP sheet. In the embodiment shown if FIGS. 19a and 19b, a square CFRP tube 1901 is placed along all top edges of the outer chassis 101. In FIG. 19a, this square CFRP tube 1901 is shown placed along one edge. An overlay CFRP reinforcing sheet 1902 is placed over the CFRP tube 1901 and overlaps both the top of the 106 chassis and the side of the chassis 105. In the embodiment shown in FIG. 19a, the CFRP reinforcing sheet 1902 is placed on the inside of the side of the chassis 105. In another embodiment, the CFRP reinforcing sheet 1902 is placed on the outside of the side of the chassis 105.

Each outer chassis side assembly 105 is comprised of a flat outer chassis side panel 501, one or more diagonal members 701, one or more horizontal members 702, and one or more vertical members 703. The diagonal members 701, horizontal members 702, and vertical members 703 are affixed to the flat outer chassis side panels via an adhesive means.

The outer chassis door is comprised of a flat outer chassis door panel 109, of one or more door diagonal members 108 and one or more door horizontal members 110. The door diagonal members 108 and the door horizontal members 110 are affixed to the flat outer chassis door panel 109 via an adhesive means.

The outer chassis top panel assembly 106 is further comprised of a flat outer chassis top panel 901, four outer chassis top side tubes 902, one or more outer chassis top edge reinforcing members 903, one or more outer top panel horizontal supports 904, and one or more metallic reinforcing strips 804. The top panel edge supports 902 and the one or more outer chassis top edge reinforcing members 903 are affixed to the outer chassis top panel assembly 106 via an adhesive means.

Figure 7:
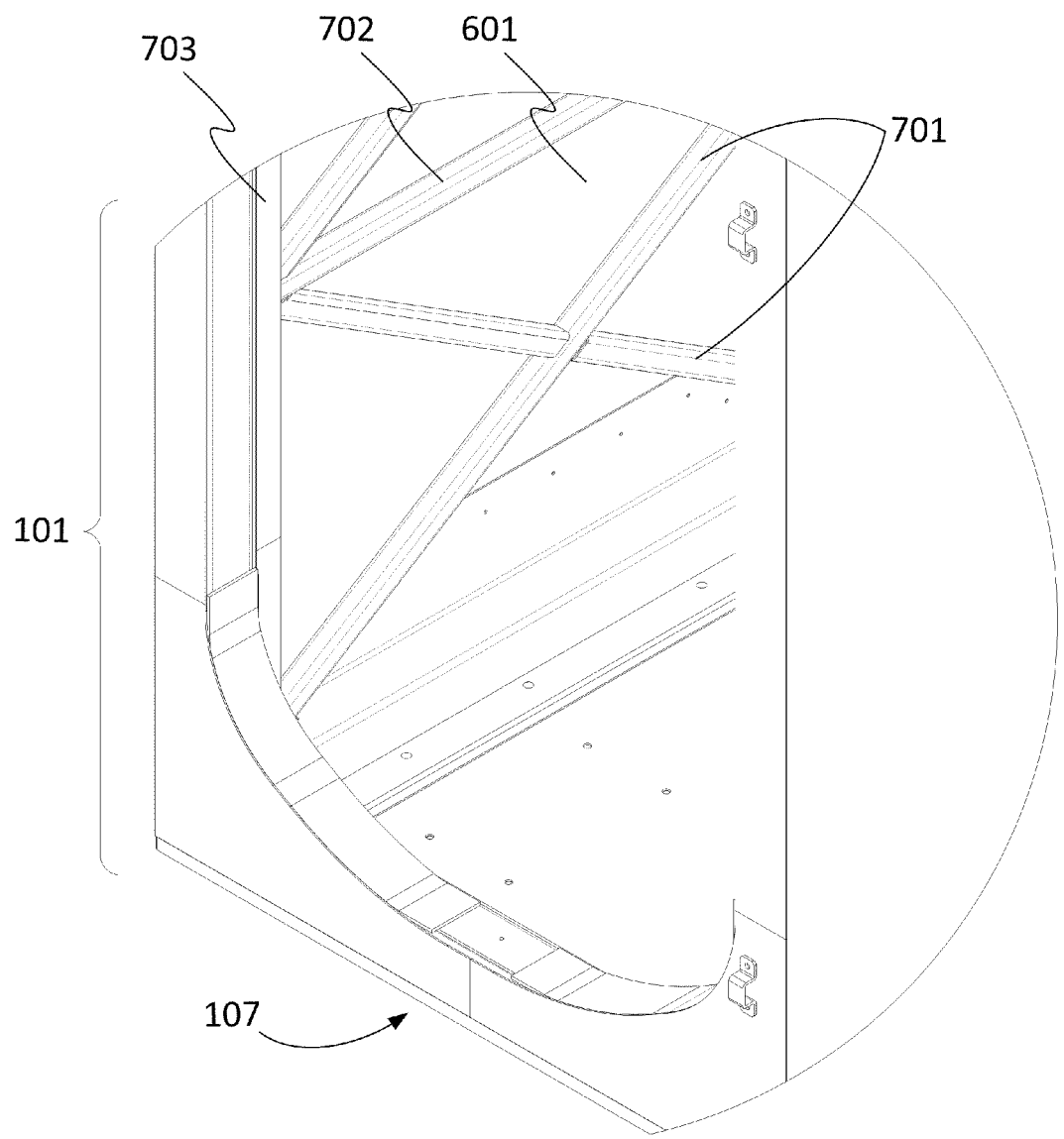
FIG. 7 is a sectional front view of the inside bottom corner of the outer chassis of an embodiment of the Robust Lightweight Electronic Rack Enclosure.
Figure 8:
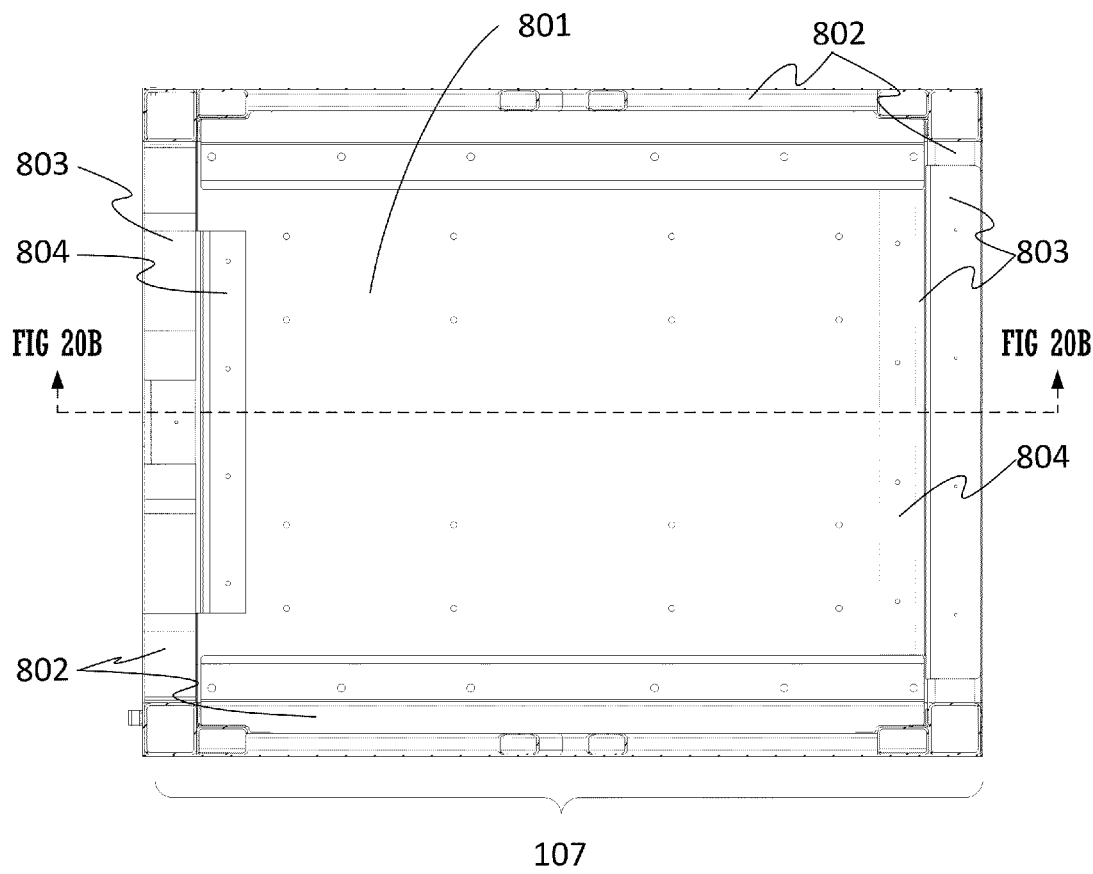
FIG. 8 is a top view of the bottom panel of the outer chassis of an embodiment of the Robust Lightweight Electronic Rack Enclosure.
Figure 9:
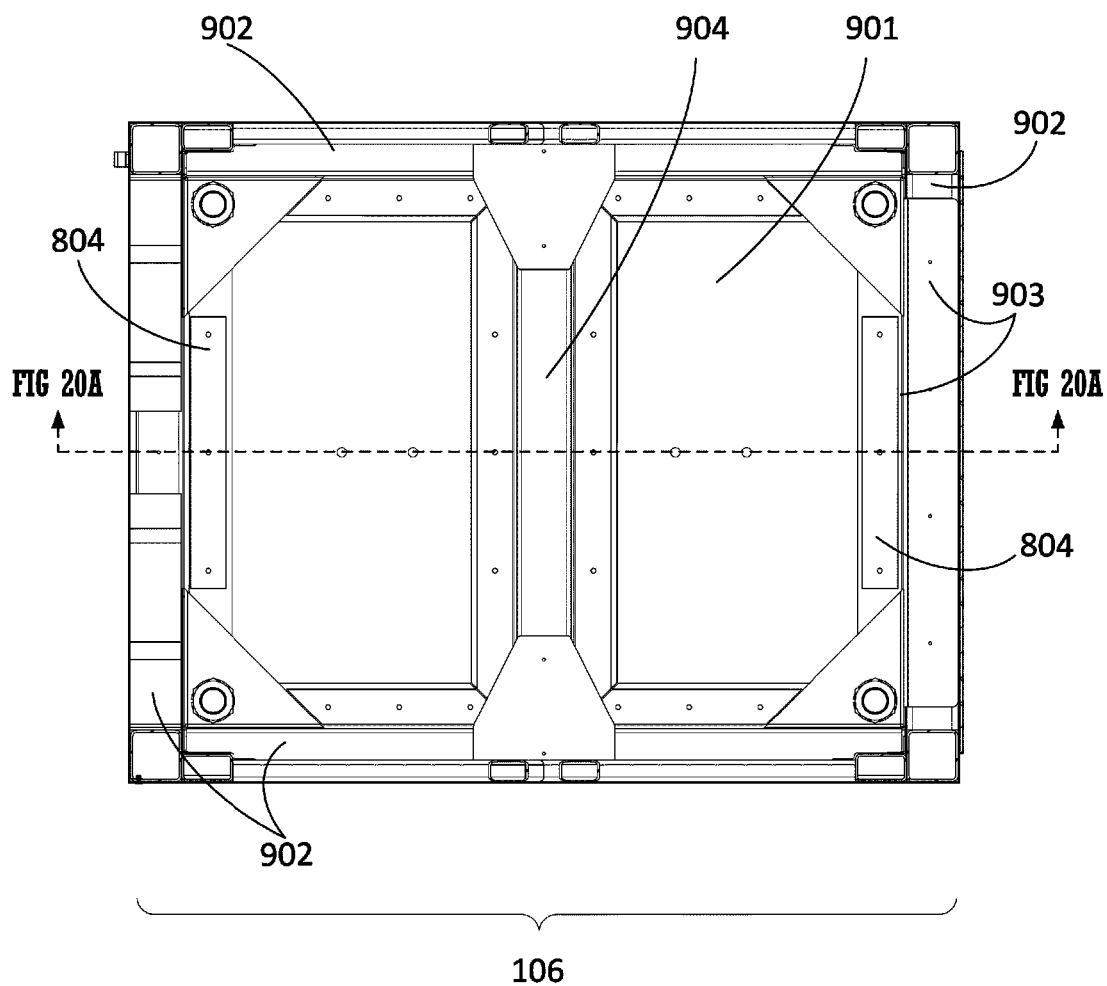
FIG. 9 is a bottom view of the top panel of the outer chassis of an embodiment the Robust Lightweight Electronic Rack Enclosure.
Figure 10:
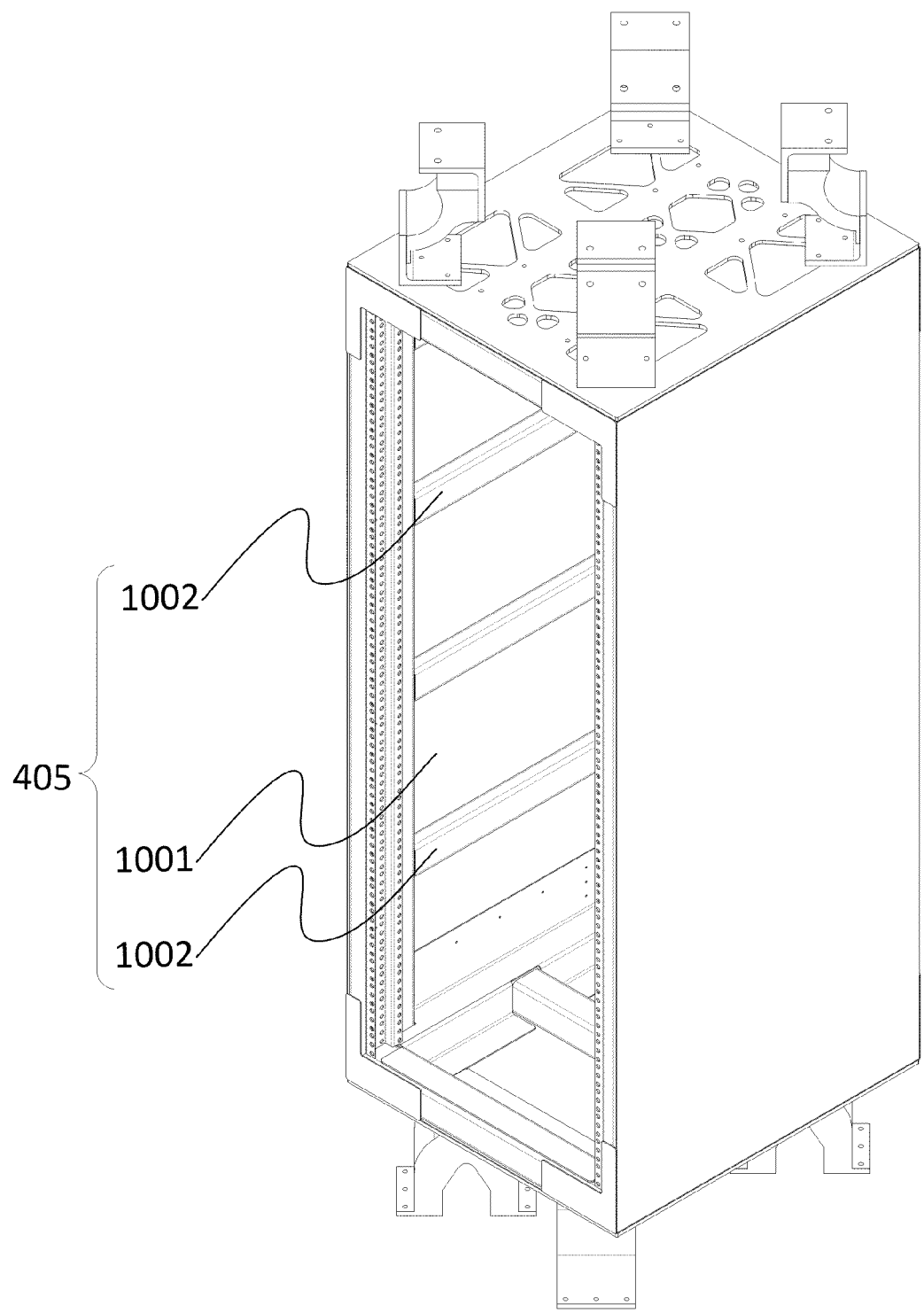
FIG. 10 is a perspective view of the inner chassis of an embodiment the Robust Lightweight Electronic Rack Enclosure.
Figure 11:
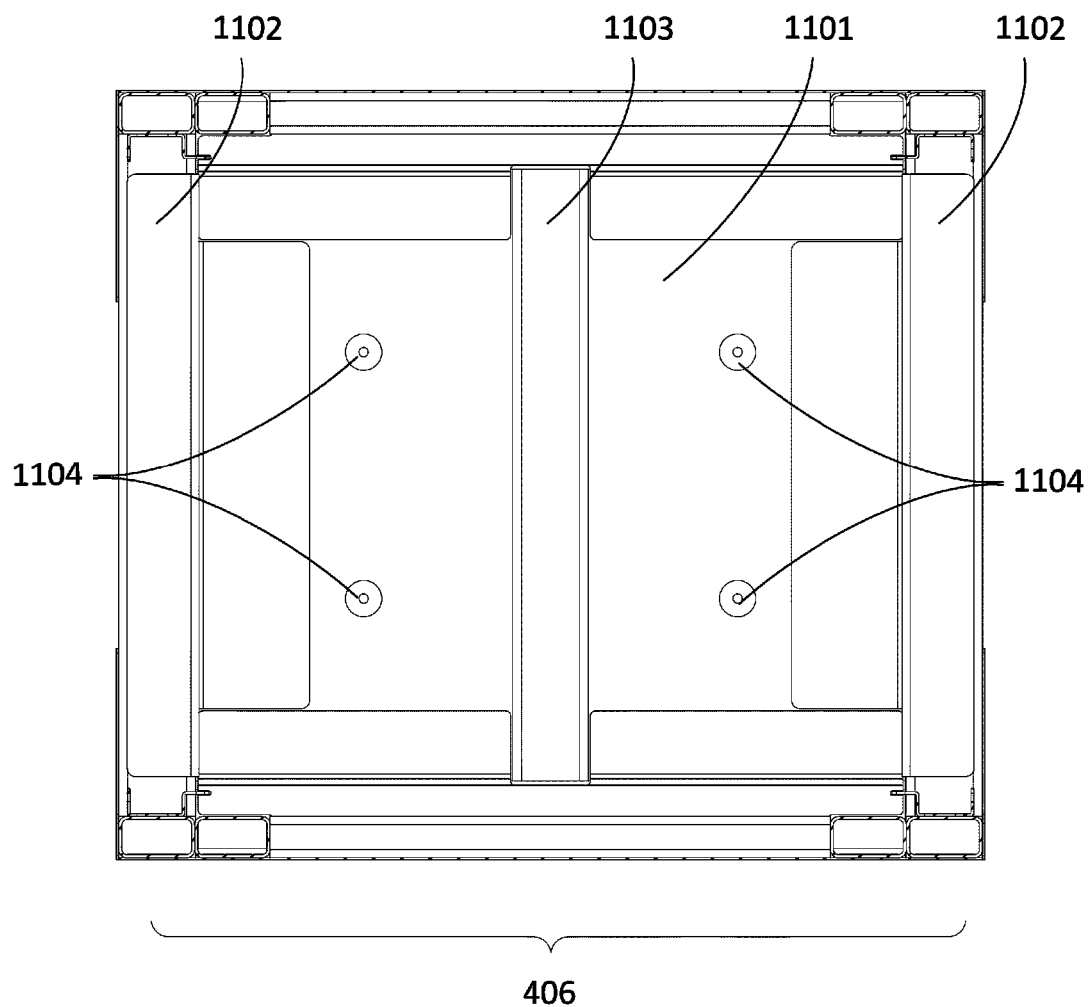
FIG. 11 is a bottom view of the top panel of the inside chassis of an embodiment of the Robust Lightweight Electronic Rack Enclosure.
Figure 12:
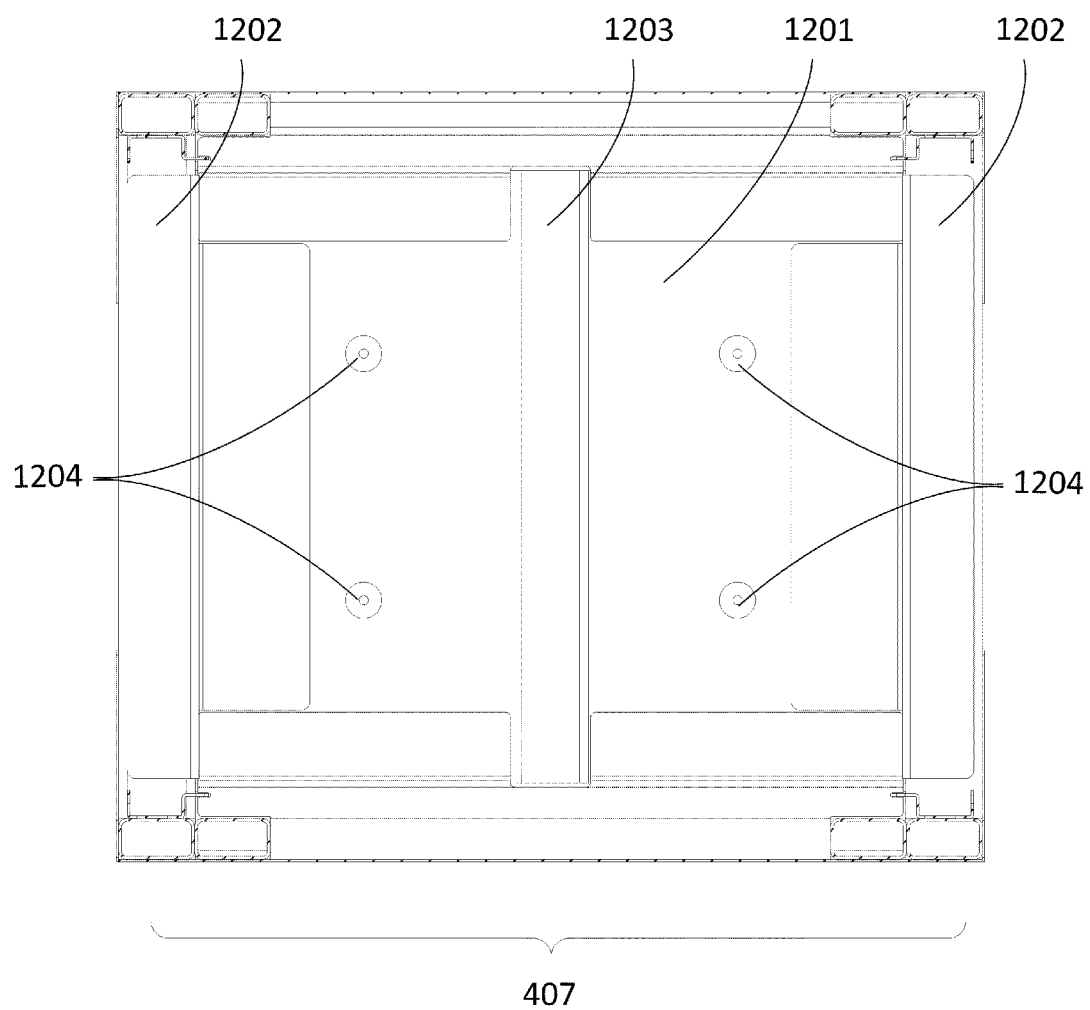
FIG. 12 is a top view of the bottom panel of the inside chassis of an embodiment of the Robust Lightweight Electronic Rack Enclosure.
Figure 13:
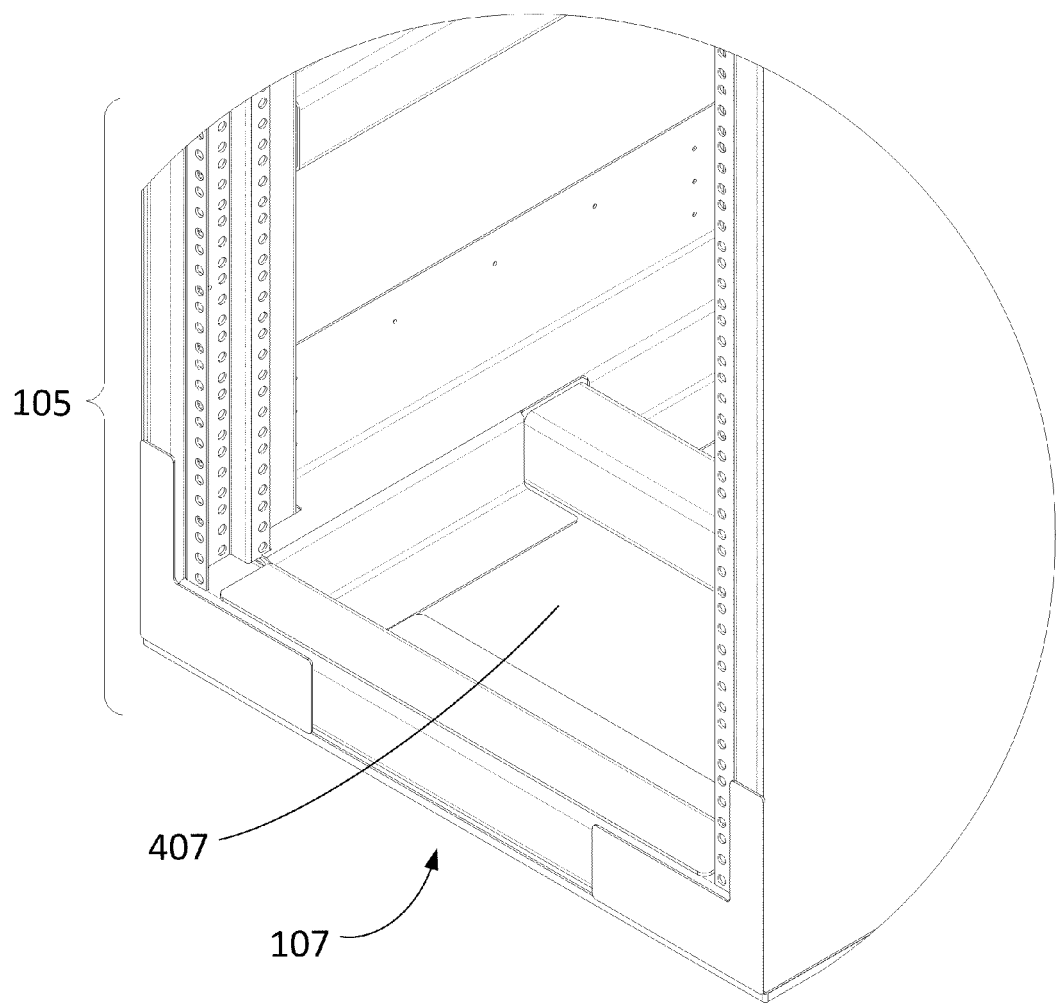
FIG. 13 is an isometric view of the inside bottom corner of the inner chassis of an embodiment of the Robust Lightweight Electronic Rack Enclosure.
Figure 14:
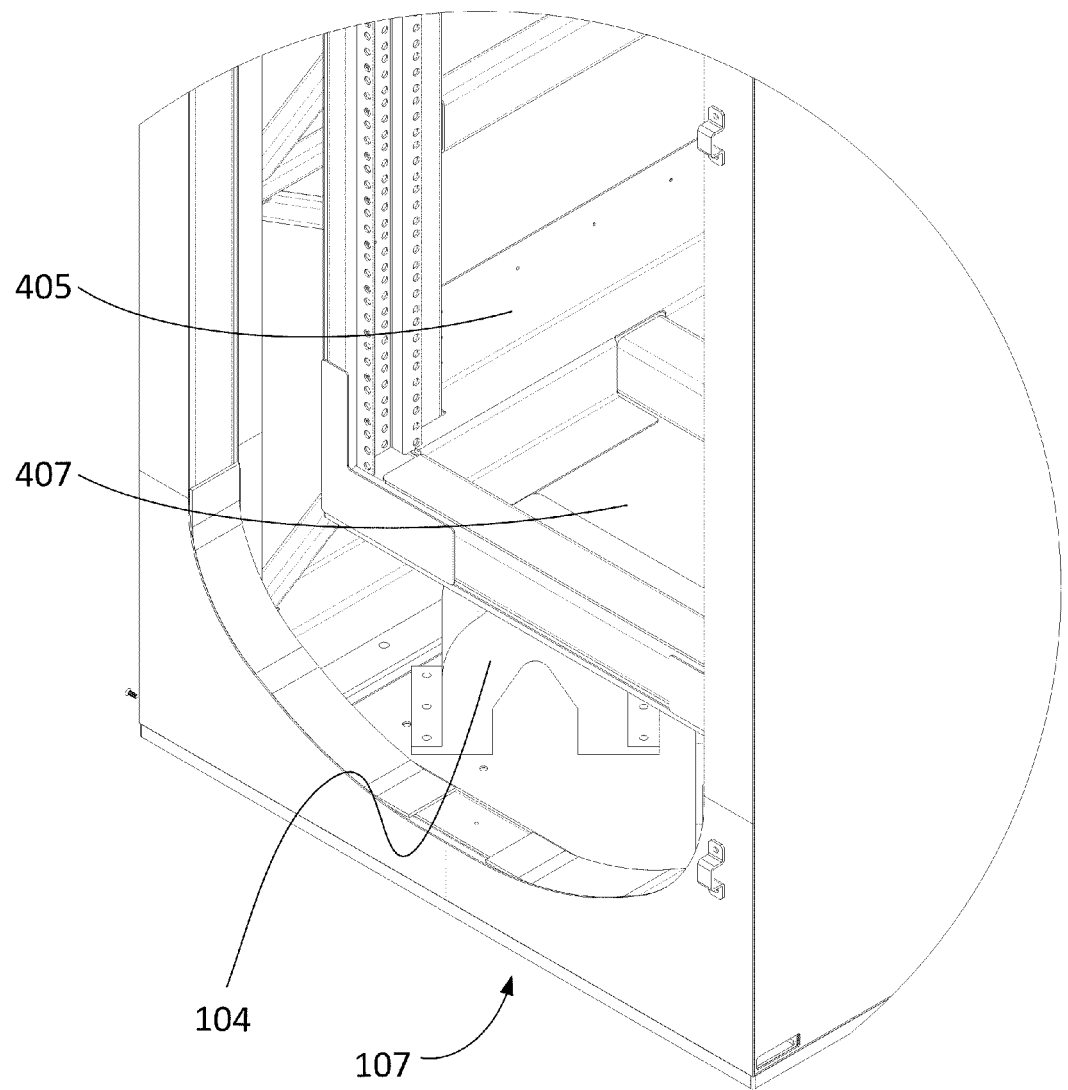
FIG. 14 is an isometric view of the complete chassis showing the outer chassis and the inner chassis and in particular showing the inside corner of both the outer and the inner chassis of an embodiment of the Robust Lightweight Electronic Rack Enclosure.
Figure 15:
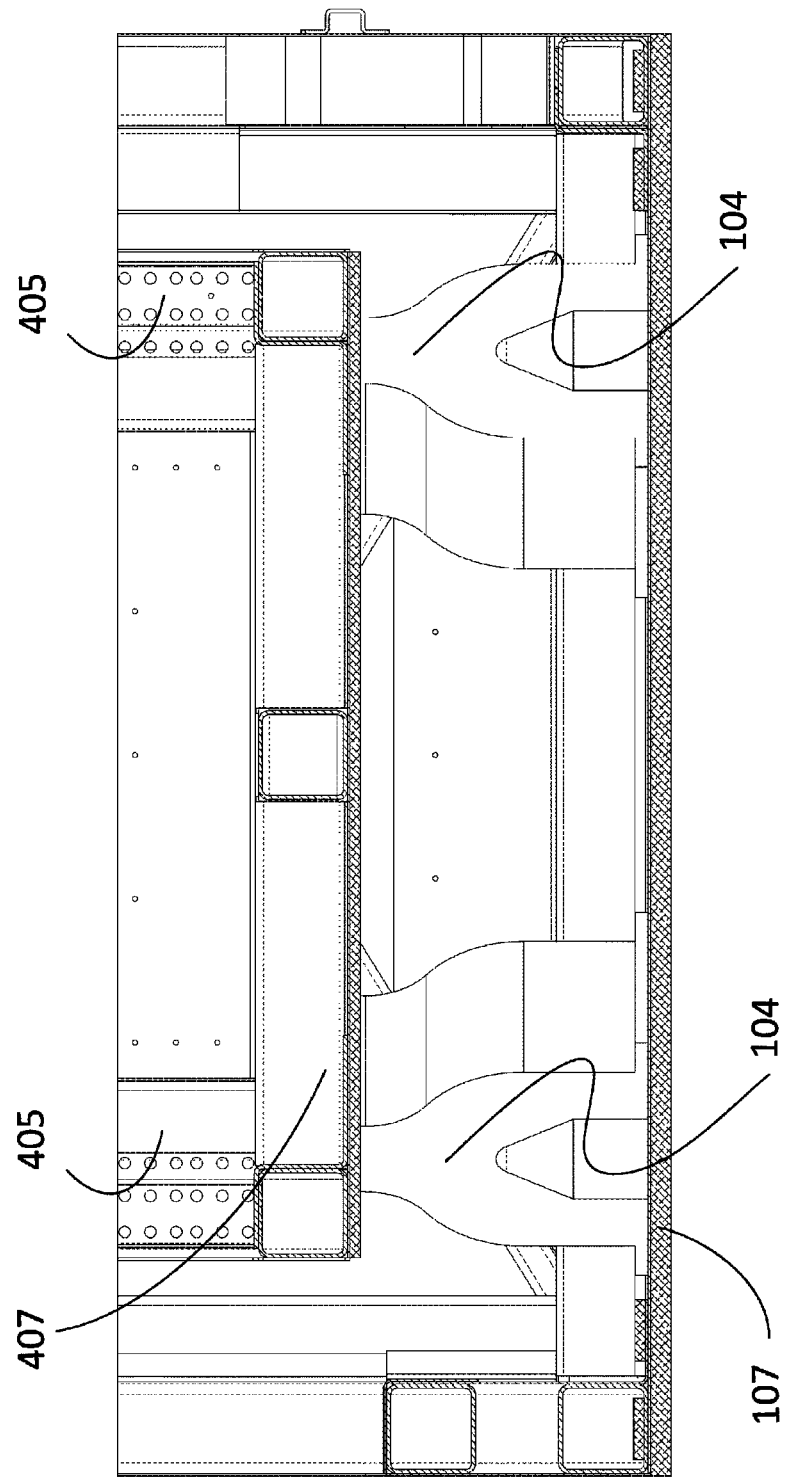
FIG. 15 is a side view of the inner and outer chassis with the inner chassis installed on top of the vibration mounts of an embodiment of the Robust Lightweight Electronic Rack Enclosure.
Figure 16:
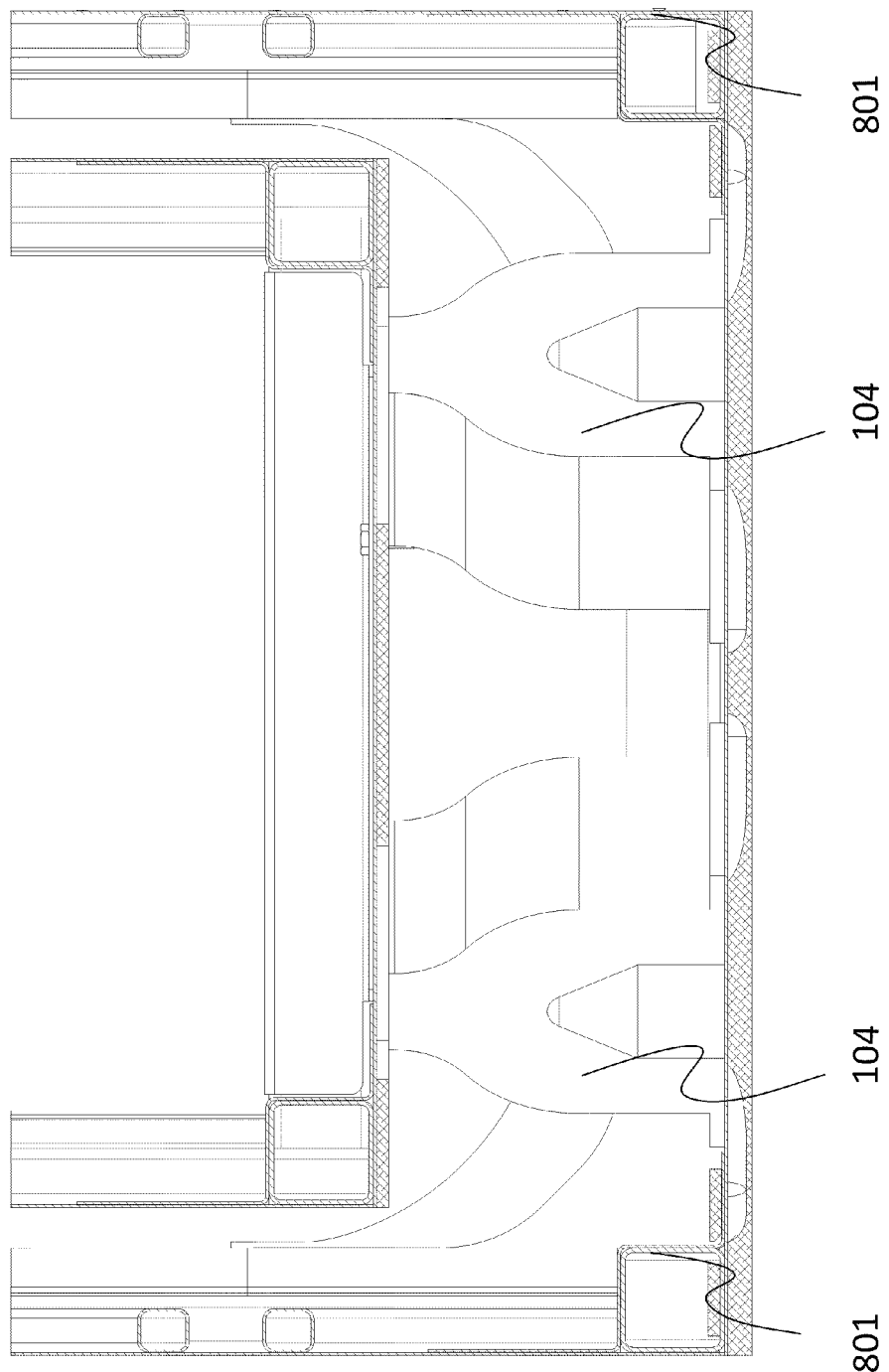
FIG. 16 is a front view showing the inner chassis installed inside the outer chassis of an embodiment of the Robust Lightweight Electronic Rack Enclosure.
Figure 17:
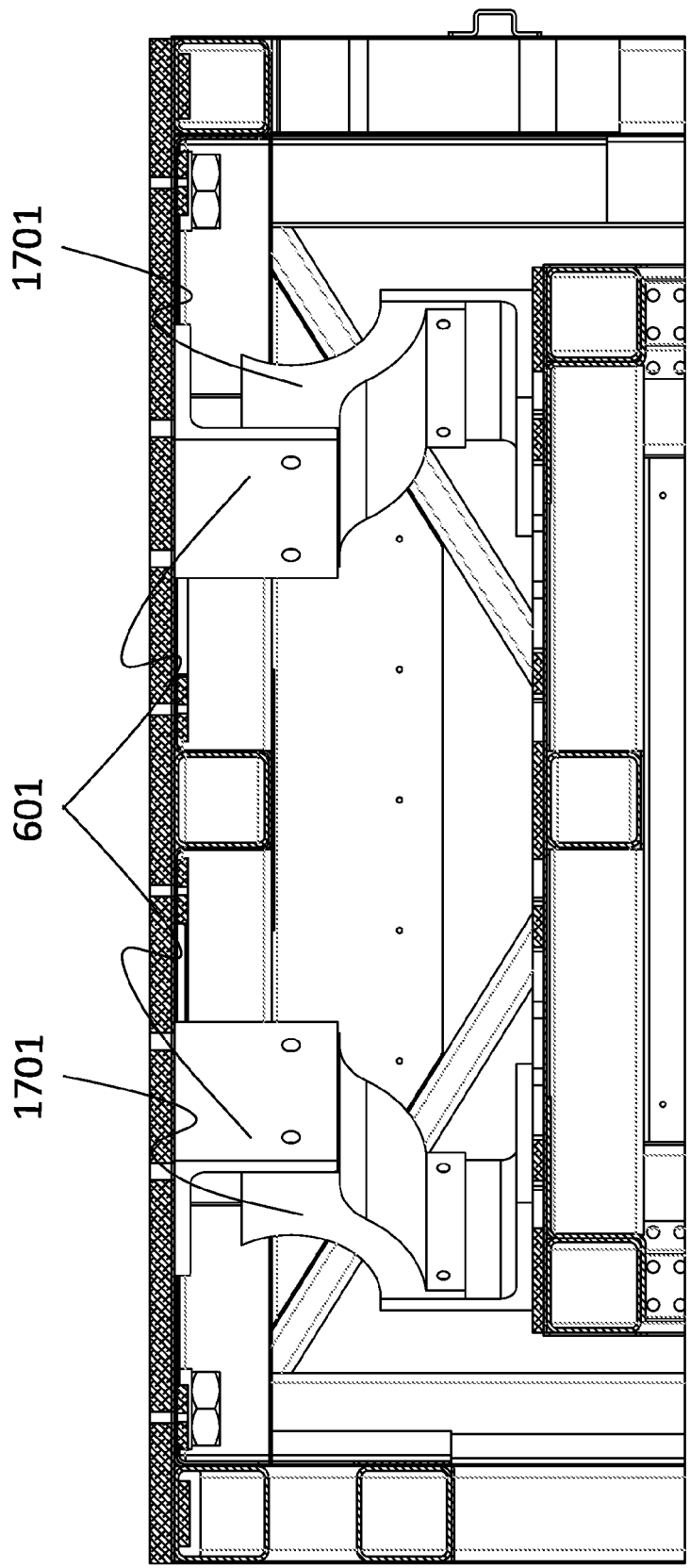
FIG. 17 is a side view showing the inner chassis installed inside the outer chassis of an embodiment of the Robust Lightweight Electronic Rack Enclosure.
Figure 18:
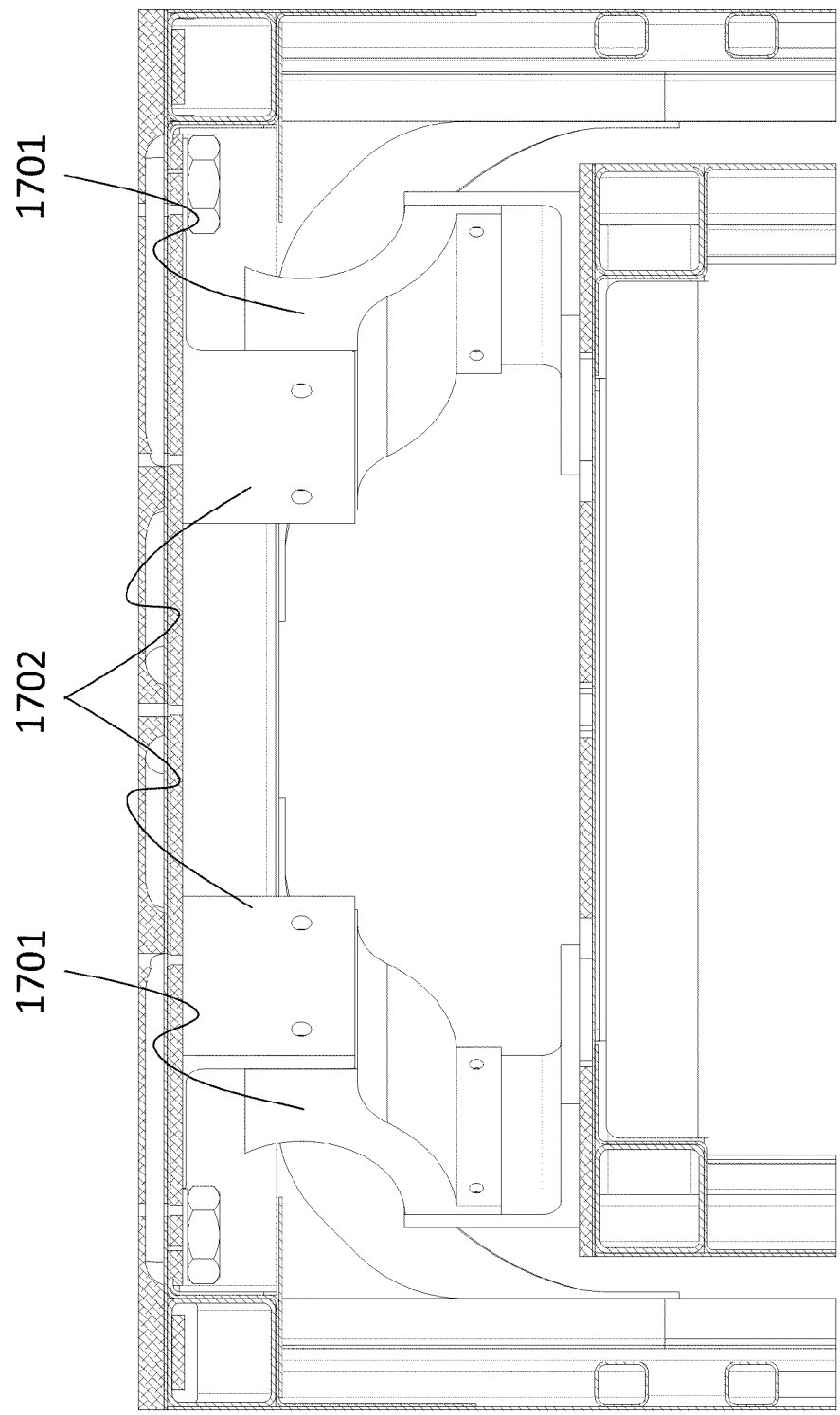
FIG. 18 is a front view showing the inner chassis installed inside the outer chassis of an embodiment of the Robust Lightweight Electronic Rack Enclosure.

The outer chassis bottom panel assembly 107 is comprised of an outer chassis bottom flat panel 801, four outer chassis bottom side tubes 802, one or more outer chassis bottom edge reinforcing members 803, and one or more metallic reinforcing strips 804. The outer chassis bottom edge reinforcing members are affixed to the outer chassis bottom flat panel via an adhesive means. In addition, the outer chassis bottom edge reinforcing members are affixed to the four outer chassis bottom side tubes 802 via an adhesive means forming an integral structure as shown in FIGS. 7 and 8. The outer chassis bottom edge reinforcing members 803 serve to strengthen the outer chassis bottom panel assembly 107, and, in turn, strengthen the entire outer chassis 101. The plurality of metallic reinforcing strips 804 serve to tie the reinforcing members 803 to further tie the outer chassis bottom edge reinforcing members 803 to the bottom flat panel 801. In one embodiment the one or more metallic reinforcing strips 804 are manufactured from aluminum.

The outer chassis back panel 103 is an unornamented flat panel constructed from CFRP as is affixed to two outer chassis side assemblies 105, one outer chassis top panel assembly 106, one outer chassis bottom panel assembly 107.

The inner chassis 150 is comprised of two inner chassis side assemblies, an inner chassis bottom panel, an inner chassis top panel.

The inner chassis side assemblies are comprised of an inner chassis flat side panel 1001, and one or more inner chassis side panel horizontal supports 1002. The inner chassis side panel horizontal supports are affixed to the inner chassis flat side panel 1001 and via an adhesive means.

The inner chassis 150 is comprised of attachment means to connect all of the inner chassis panels to form essentially smaller upright rectangular chassis that fits inside of the outer chassis. All components of both the outer chassis and the inner chassis 150 are comprised of lightweight carbon fiber components.

The inner chassis 150 is installed inside the outer chassis and secured by a plurality of bottom vibration isolators 104 and a plurality of top vibration isolators 1701. The plurality of bottom vibration isolators are secured to the outer chassis bottom panel assembly 107 via fasteners. The plurality of bottom vibration isolators are also secured to the inner chassis bottom panel 407 via fasteners. The plurality of top vibration isolators are secured to the outer chassis top panel assembly 106 via fasteners. The plurality of top vibration isolators are also secured to the inner chassis top panel 406 via fasteners. Fasteners include without limitation screws, rivets, or bolts.

In the best mode of operating the embodiments of the Robust Lightweight Electronic Rack Enclosure, the inner chassis 150 is installed inside of the outer chassis 101. The inner chassis 150 is secured to the outer chassis 101 through a plurality of top vibration isolators 1701 and bottom vibration isolators 104. The top 1701 and bottom 104 vibration isolators are secured to the inner chassis 150 and outer chassis 101 via fasteners. At this point electronic racks can be installed into the inner chassis. These electronic racks can in turn be electronically connected and employed in the application environment.

What is claimed is:

1. A lightweight electronic rack system comprising
   a. an outer chassis,
   b. an inner chassis,
   c. one or more bottom vibration isolators;
   d. one or more top vibration isolators;
   e. wherein the inner chassis is installed inside the outer chassis and secured by the one or more bottom vibration isolators and the one or more top vibration isolators;
   f. wherein the one or more bottom vibration isolators are secured to an outer chassis bottom panel assembly via fasteners;
   g. wherein the one or more bottom vibration isolators are also secured to an inner chassis bottom panel a via fasteners;

h. wherein the one or more top vibration isolators are secured to an outer chassis top panel assembly via fasteners;

i. wherein the one or more top vibration isolators are also secured to an inner chassis top panel assembly fasteners;

j. wherein the outer chassis and the inner chassis are comprised of subcomponents manufactured from carbon fiber-reinforced polymer;

k. wherein the inner and outer chassis are assembled by mating components via an adhesive means;

l. wherein structural reinforcing components of each component of the outer chassis and inner chassis strengthen the outer chassis and inner chassis to accommodate stress modes that the components experience and to provide mating surfaces to which the adhesive means can be applied to assemble the outer chassis and inner chassis;

m. wherein the stress modes comprise elongational, compressional, flexural and torsional stresses of various frequencies and amplitudes;

n. wherein the structural reinforcing components are comprised of hollow tubes manufactured from CFRP; and o. wherein the cross-sectional geometry of the hollow CFRP tubes is circular, square, triangular or rectangular.

2. The lightweight electronic rack system as set forth in claim 1 a. wherein the outer chassis is comprised of an outer chassis door, two outer chassis side assemblies, the outer chassis top panel assembly, the outer chassis bottom panel assembly, and an outer chassis back panel; and b. wherein the inner chassis is comprised of two inner chassis side assemblies, the inner chassis top panel assembly, and the inner chassis bottom panel assembly.

3. The lightweight electronic rack system as set forth in claim 2 wherein a. the inner chassis top panel assembly is comprised of a top panel which forms apertures through which various hardware such as hooks and hangers can be mounted;

b. the inner chassis top panel assembly is comprised of inner top panel edge members and inner top panel center members which provide structural support for the top panel;

c. the inner chassis bottom panel assembly is comprised of a bottom panel which forms apertures through which various hardware such as hooks and hangers can be mounted; and d. the inner chassis bottom panel assembly is comprised of inner bottom panel edge members and inner bottom panel center members which provide structural support for the bottom panel.

4. The lightweight electronic rack system as set forth in claim 2 wherein the structural reinforcing components comprise diagonal, horizontal and vertical reinforcing flanges attached to inside surfaces of the inner and outer assemblies, a. wherein each structural horizontal reinforcing component (802, 803, 1902) is brought into contact with the corresponding horizontal plane of the corresponding mating surface to form an adhesive joint;

b. wherein the adhesive joint is cured to form a permanent adhesive joint.

5. The lightweight electronic rack system as set forth in claim 2 wherein the cross-sectional geometry of the hollow CFRP tubes is square or rectangular with a side dimension of between ½ inch and 3 inches.

6. The lightweight electronic rack system as set forth in claim 2 wherein upper and lower edges of the inner chassis are constructed and reinforced with hollow tube structural reinforcing components and an overlay of CFRP sheet.

7. The lightweight electronic rack system as set forth in claim 6 wherein a square CFRP tube is placed along all the upper edges of the inner chassis and an overlay CFRP reinforcing sheet is placed over the CFRP tube and overlaps both the top of the inner chassis and the side of the inner chassis and wherein the overlay CFRP reinforcing sheet is further affixed to the top of the inner chassis.

8. The lightweight electronic rack system as set forth in claim 7 wherein the CFRP reinforcing sheet is placed on the outside of the side of the inner chassis frame.

9. The lightweight electronic rack system as set forth in claim 8 wherein the CFRP reinforcing sheet is placed on the inside of the side of the inner chassis frame.

10. The lightweight electronic rack system as set forth in claim 2 wherein upper and lower edges of the inner and outer chassis are constructed and reinforced with hollow tube structural reinforcing components and an overlay of CFRP sheet.

11. The lightweight electronic rack system as set forth in claim 10 wherein a square CFRP tube is placed along all of the upper edges of the inner and outer chassis and an overlay CFRP reinforcing sheet is placed over the CFRP tube and overlaps both the top of the outer chassis and the side of the outer chassis.

12. The lightweight electronic rack system as set forth in claim 11 wherein the CFRP reinforcing sheet is placed on the outside of the side of the outer chassis frame.

13. The lightweight electronic rack system as set forth in claim 12 wherein the CFRP reinforcing sheet is placed on the inside of the side of the outer chassis frame.

14. A lightweight electronic rack system comprising a. an outer chassis, b. an inner chassis, c. one or more bottom vibration isolators;

d. one or more top vibration isolators;

e. wherein the inner chassis is installed inside the outer chassis and secured by the one or more bottom vibration isolators and the one or more top vibration isolators;

f. wherein the one or more bottom vibration isolators are secured to an outer chassis bottom panel assembly via fasteners;

g. wherein the one or more bottom vibration isolators are also secured to an inner chassis bottom panel assembly via fasteners;

h. wherein the one or more vibration isolators are secured to an outer chassis top panel assembly via fasteners;

i. wherein the one or more top vibration isolators are also secured to an inner chassis top panel assembly via fasteners;

j. wherein the fasteners comprise screws, rivets, or bolts;

k. wherein the outer chassis and the inner chassis are comprised of subcomponents manufactured from carbon fiber-reinforced polymer;

l. wherein the inner and outer chassis are assembled by mating components via a fastener;

m. wherein the structural reinforcing components of each component of the outer chassis and inner chassis strengthen the outer chassis and inner chassis to accommodate stress modes that the components experience and to provide mating surfaces to which fasteners can be affixed to assemble the outer chassis and inner chassis;

n. wherein the stress modes comprise elongational, compressional, flexural and torsional stresses of various frequencies and amplitudes;

o. wherein the structural reinforcing components are comprised of hollow tubes manufactured from CFRP; and p. wherein the cross-sectional geometry of the hollow CFRP tubes is circular, square, triangular or rectangular.

15. The lightweight electronic rack system as set forth in claim 14
  a. wherein the outer chassis is comprised of an outer chassis door, two outer chassis side assemblies, the outer chassis top panel assembly, the outer chassis bottom panel assembly, and an outer chassis back panel; and
  b. wherein the inner chassis is comprised of two inner chassis side assemblies, the inner chassis top panel assembly, and the inner chassis bottom panel assembly.

16. The lightweight electronic rack system as set forth in claim 15 wherein
  a. the inner chassis top panel assembly is comprised of a top panel which forms apertures through which various hardware such as hooks and hangers can be mounted;
  b. the inner chassis top panel assembly is comprised of inner top panel edge members and inner top panel center members which provide structural support for the top panel;
  c. the inner chassis bottom panel assembly is comprised of a bottom panel which forms apertures through which various hardware such as hooks and hangers can be mounted; and
  d. the inner chassis bottom panel assembly is comprised of inner bottom panel edge members and inner bottom panel center members which provide structural support for the bottom panel.

* * * * *